(12) United States Patent
Wu et al.

(10) Patent No.: US 6,232,634 B1
(45) Date of Patent: May 15, 2001

(54) NON-VOLATILE MEMORY CELL AND METHOD FOR MANUFACTURING SAME

(75) Inventors: Yun-Kang (Kevin) K. Wu; Danny P. Shum; Craig Thomas Swift, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/124,592

(22) Filed: Jul. 29, 1998

(51) Int. Cl.$^7$ .................... H01L 29/788; G11C 16/04; G11C 11/34
(52) U.S. Cl. .................... 257/316; 257/315; 257/321; 257/320; 365/187; 365/185.05
(58) Field of Search .................... 257/320, 321, 257/315, 316; 365/187, 185.05, 185.11, 185.26

(56) References Cited

U.S. PATENT DOCUMENTS

| | | | |
|---|---|---|---|
| 4,380,804 | 4/1983 | Lockwood et al. | 365/184 |
| 4,855,955 | 8/1989 | Cioaca | 365/185 |
| 5,170,373 | 12/1992 | Doyle et al. | 365/185 |
| 5,471,422 | 11/1995 | Chang et al. | 365/185.26 |
| 5,646,060 | 7/1997 | Chang et al. | 437/43 |
| 5,877,980 | * | 3/1999 | Mang | 257/320 |
| 5,912,489 | * | 6/1999 | Chen | 257/321 |

* cited by examiner

*Primary Examiner*—Jerome Jackson, Jr.
(74) *Attorney, Agent, or Firm*—Anthony M. Martinez

(57) ABSTRACT

A non-volatile memory cell (81) includes a drain-side select transistor (86), a source-side select transistor (87), and a storage transistor (88). The drain-side select transistor (86) is adjacent to the drain of the storage transistor (88) to prevent drain-disturb events. The source-side select transistor (87) is adjacent to the source of the storage transistor (88) to prevent source-disturb events. The select gate (152) of the drain-side select transistor (86), the select gate (143) of the source-side select transistor (87), and the floating gate (147) of the storage transistor (88) are formed on a dielectric layer (123) having a uniform thickness.

20 Claims, 3 Drawing Sheets

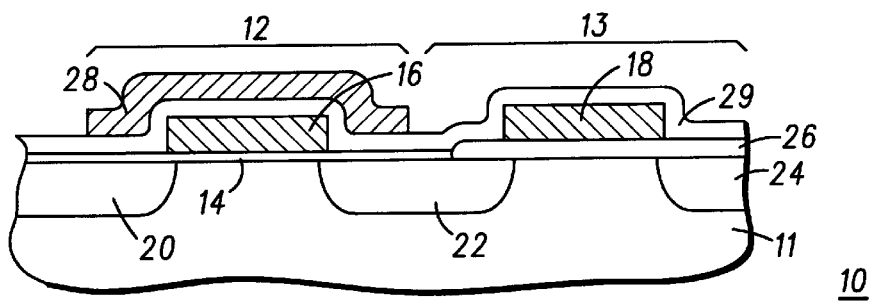
FIG. 1 —PRIOR ART—
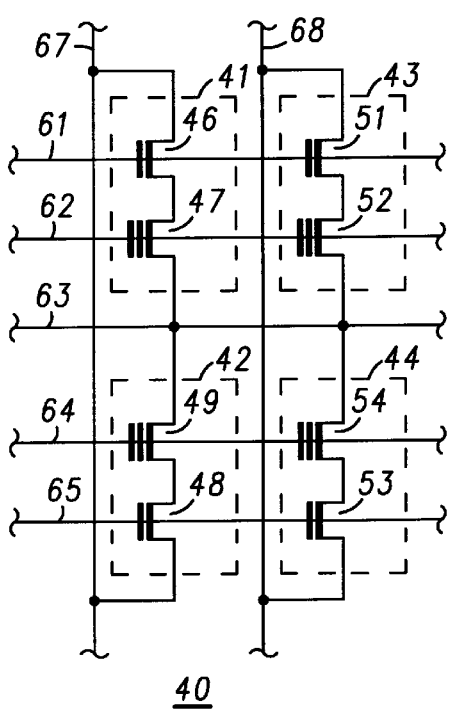
FIG. 2 —PRIOR ART—
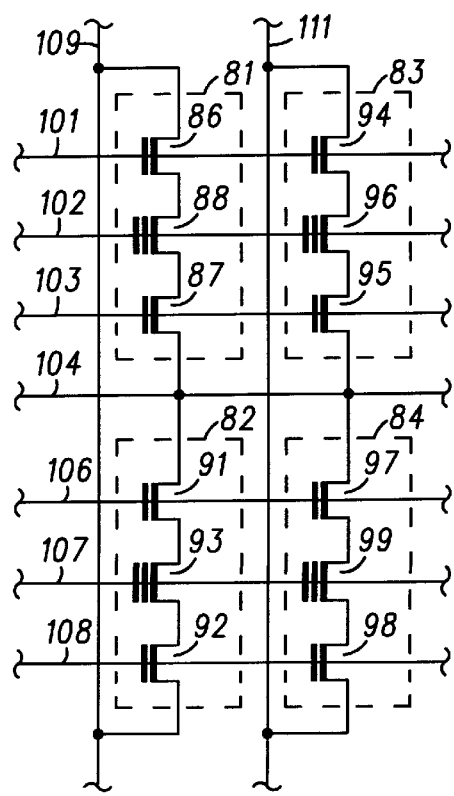
FIG. 3

| | SELECTED ROW (VOLTS) | | UNSELECTED ROW (VOLTS) |
|---|---|---|---|
| | PROGRAM | ERASE | |
| CONTROL GATE | −12/12 | −12/12 | 0 |
| DRAIN-SIDE SELECT GATE | 5 | 5 | 0 |
| SOURCE-SIDE SELECT GATE | 0 | 0 | 0 |
| DRAIN | 5 | 0 | — |
| SOURCE | 0 | 0 | 0 |

*190*

US 6,232,634 B1

NON-VOLATILE MEMORY CELL AND METHOD FOR MANUFACTURING SAME

The present application is related to co-pending U.S. Patent Application having Ser. No. 09/124,466, entitled "METHOD AND APPARATUS FOR WRITING AN ERASABLE NON-VOLATILE MEMORY" by Bruce L. Morton, filed concurrently herewith and assigned to the same assignee, Motorola, Inc.

FIELD OF THE INVENTION

The present invention relates, in general, to non-volatile semiconductor memory devices and, more particularly, to non-volatile Electrically Erasable and Programmable Read-Only Memory (EEPROM) cells.

BACKGROUND OF THE INVENTION

Electrically Erasable and Programmable Read-Only Memory (EEPROM) devices are Non-Volatile Memory (NVM) devices that are erased and programmed using electrical signals. An EEPROM device typically includes several thousand memory cells organized in an array. In general, a memory cell includes a floating gate transistor and a select transistor. This configuration is referred to as a two-transistor EEPROM cell. The select transistor in an EEPROM device is used to select memory cells that are to be erased or programmed. A selected memory cell refers to a memory cell that is either being programmed, erased, or read. On the other hand, unselected memory cells are the memory cells of the array that are not selected for programming, erasing, or reading. The floating gate transistors in the device are those transistors that store the digital data in each memory cell. Typically, the digital data is stored as eight bit words called bytes. Each byte may be individually programmed and erased.

To program and erase memory cells, a phenomenon known as Fowler-Nordheim (FN) tunneling is commonly used to store either a positive or a negative charge on the floating gate electrode of the floating gate transistor. For example, programming is accomplished by applying a positive voltage to the drain and the gate of the select transistor while a control gate of the floating gate transistor is held at ground potential. As a result, electrons tunnel from the floating gate of the floating gate transistor through a tunnel dielectric to the drain, leaving the floating gate positively charged.

A disadvantage with two-transistor EEPROM cells is that the gate oxide thickness of the floating gate transistor is different from the gate oxide thickness of the select transistor. The floating gate transistor has a thinner gate oxide to allow electron tunneling through the gate oxide, whereas the select transistor has a thicker gate oxide to sustain large programming voltages. The thicker gate oxide of the select transistors causes the access time of the memory cell to be relatively long.

Prior art memory arrays are configured such that their memory cells are arranged in rows and columns. Typically, the gates of the transistors within the same row are connected to each other and to a common word line. Similarly, the drain electrodes of the transistors within the same column are connected to each other and to a common bit line. In addition, the source electrodes of the transistors are typically connected to each other via a common source line.

To program a selected memory cell in a selected row and a selected column, a programming voltage is applied to either or both the word line or the bit line which is connected to the selected memory cell. Well known problems referred to as "gate-disturb," "drain-disturb," and "source-disturb" events can occur when programming the selected cell. A gate-disturb event occurs in unselected memory cells that are connected to the same word line as the selected memory cell. During programming, the unselected memory cells in the same row as the selected memory cell also have the programming voltage applied to their gates. Thus, electrons may tunnel through the tunnel dielectrics of the unselected memory cells, unintentionally programming them. A drain-disturb event occurs in unselected memory cells that are connected to the same bit line as the selected memory cell. During programming, the unselected memory cells in the same column as the selected memory cell may have a high electric field applied between their floating gates and drains. This causes electrons to unintentionally tunnel between the floating gate and the drain of the unselected memory cell. Similarly, since the source electrodes of the selected and unselected cells are connected to each other, a source-disturb event can occur in unselected memory cells.

Accordingly, it would be advantageous to have a non-volatile memory device that prevents disturb problems in unselected memory cells. It would be of further advantage to have a method for manufacturing the non-volatile memory device that is compatible with standard semiconductor processing techniques and is cost efficient.

BRIEF DESCRIPTION OF THE DRAWINGS

FIG. 1 is a cross-sectional view of a prior art Electrically Erasable and Programmable Read-Only Memory (EEPROM) cell;

FIG. 2 is a schematic diagram of a prior art memory array;

FIG. 3 is schematic diagram of a portion of a Non-Volatile Memory (NVM) array in accordance with an embodiment of the present invention;

DETAILED DESCRIPTION OF THE DRAWINGS

Figure 4:
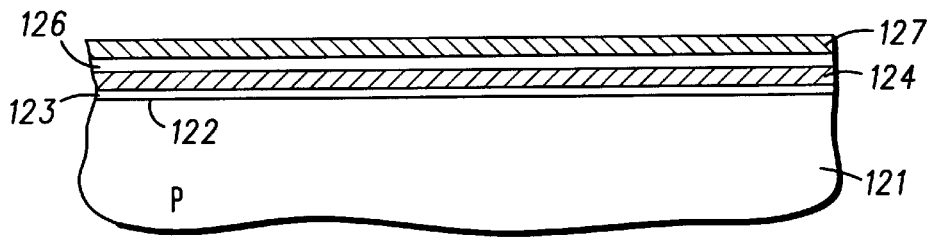
FIG. 4 is a cross-sectional view of an EEPROM cell of the array of FIG. 3 during processing in accordance with the present invention.

Generally, the present invention provides a Non-Volatile Memory (NVM) cell and a method for manufacturing the NVM cell. The NVM cell is a three-transistor Electrically Erasable and Programmable Read-Only Memory (EEPROM) memory cell. The memory cell includes two select transistors and a storage transistor. One select transistor, referred to as the drain-side select transistor, is adjacent to the drain region of the storage transistor and helps to prevent drain-disturb events. The other select transistor, referred to as the source-side select transistor, is adjacent to the source region of the storage transistor and helps to prevent source-disturb events and prevents Direct Current (DC) leakage between adjacent bit lines. The floating gate electrode of the storage transistor and the gate electrodes of the select transistors are formed on a tunnel dielectric layer having a substantially uniform thickness. The substantially uniform thickness of the tunnel dielectric layer results in a faster operating NVM device by decreasing the access time of the NVM cell during read operations.

FIG. 1 is a cross-sectional view of prior art two-transistor EEPROM cell 10. As illustrated in FIG. 1, cell 10 includes a semiconductor substrate 11 on which a floating gate transistor 12 and a select transistor 13 are formed. Floating gate transistor 12 is comprised of a tunnel dielectric layer 14 overlying substrate 11 and a floating gate 16, a control gate 28, and a dielectric layer 29 overlying tunnel dielectric layer 14. Control gate 28 is formed over floating gate 16 and is separated from floating gate 16 by dielectric layer 29. Because gates 16 and 28 are typically formed of polycrystalline silicon or polysilicon, dielectric layer 29 is also known as an interpoly dielectric layer. Further, floating gate transistor 12 includes a source region 20 and a drain region 22 formed in substrate 11.

Select transistor 13 includes drain region 24 formed in substrate 11, a select gate 18, and a gate dielectric layer 26 separating gate 18 from substrate 11. In addition, select transistor 13 includes doped region 22, wherein doped region 22 serves as both the source region of select transistor 13 and as the drain region of floating gate transistor 12. Doped regions 20, 22, and 24 are doped with an impurity material of N conductivity type. It should be noted that gate dielectric layer 26 has a thickness greater than tunnel dielectric layer 14.

One example for fabricating cell 10 is briefly discussed with reference to FIG. 1. Gate dielectric layer 26 is formed on substrate 11. A mask (not shown) is formed over the region of select transistor 13 to protect it from a subsequent chemical wet etch which removes unmasked portions of gate dielectric layer 26. As a result, gate dielectric layer 26 is removed from the surface of substrate 11 in the region of floating gate transistor 12. Following the removal of a portion of gate dielectric layer 26, tunnel dielectric layer 14 is grown on a portion of the surface of substrate 11. A first polysilicon layer is deposited on dielectric layers 14 and 26. The polysilicon layer is patterned using photolithography to form floating gate 16 and select gate 18. Next, interpoly dielectric layer 29 is deposited on gates 16 and 18 and on portions of dielectric layers 14 and 26. An ion implantation step is performed to form doped regions 20, 22, and 24, which are self-aligned to the sidewalls of gates 16 and 18. A second polysilicon layer is deposited on interpoly dielectric layer 29 and is patterned to form control gate 28.

It should be noted that source region 20 is the source of cell 10, control gate 28 is the control gate of cell 10, select gate 18 is the select gate of cell 10, and drain region 24 is the drain of cell 10.

Cell 10 is programmed and erased using Fowler-Nordheim (FN) tunneling. During a program operation, select transistor 13 of cell 10 is turned on by applying a programming voltage of approximately 17 volts to both select gate 18 and drain region 24. In order to withstand voltages on the order of 17 volts, a typical thickness for dielectric layer 26 ranges between 200 angstroms and 500 angstroms.

FIG. 2 is a schematic diagram of a prior art memory array 40. Memory array 40 includes a plurality of two-transistor memory cells 41, 42, 43, and 44 arranged in two rows and two columns. Memory cells 41, 42, 43, and 44 have a structure similar to two-transistor memory cell 10 of FIG. 1, wherein each memory cell has a select transistor and a floating gate transistor. More particularly, cell 41 has a select transistor 46 and a floating gate transistor 47; cell 42 has a select transistor 48 and a floating gate transistor 49; cell 43 has a select transistor 51 and a floating gate transistor 52; and cell 44 has a select transistor 53 and a floating gate transistor 54. For each memory cell, the drain of the select transistor is the drain of the memory cell and the source of the floating gate transistor is the source of the memory cell. In addition, the control gate of the floating gate transistor is the control gate of the memory cell and the select gate of the select transistor is the select gate of the memory cell.

The select gates of memory cells 41 and 43 are connected to a word line 61 and the control gates of memory cells 41 and 43 are connected to a word line 62. The source electrodes of memory cells 41, 42, 43, and 44 are connected to each other via a common source line 63. In addition, the control gates of memory cells 42 and 44 are connected to a word line 64 and the select gates of memory cells 42 and 44 are connected to a word line 65. Further, the drain electrodes of memory cells 41 and 42 are connected to a bit line 67 and the drain electrodes of memory cells 43 and 44 are connected to a bit line 68.

Since the source electrodes of all of the memory cells of array 40 are connected to each other via a common source line, a source-disturb event can occur. For example, during programming of selected memory cell 41, programming voltages are applied to the drain, the control gate, and the select gate of selected memory cell 41. Therefore, the drain programming voltage is transmitted to the common source line 63 which can disturb unselected memory cells 42, 43, and 44.

FIG. 3 is schematic diagram of a portion of an NVM array 80 in accordance with an embodiment of the present invention. NVM array 80 includes a plurality of three-transistor EEPROM cells 81, 82, 83, and 84 arranged in two rows and two columns. The first column includes memory cells 81 and 82 and the second column includes memory cells 83 and 84. The first row includes memory cells 81 and 83 and the second row includes memory cells 82 and 84. Each of the plurality of memory cells of NVM array 80 is comprised of a storage transistor and two select transistors. More particularly, cell 81 has select transistors 86 and 87 and a storage transistor 88; cell 82 has select transistors 91 and 92 and a storage transistor 93; cell 83 has select transistors 94 and 95 and a storage transistor 96; and cell 84 has select transistors 97 and 98 and a storage transistor 99.

The storage transistors of memory cells 81, 82, 83, and 84 are floating gate transistors having a control gate electrode, a floating gate electrode, a drain electrode, and a source electrode. The select transistors of memory cells 81, 82, 83, and 84 are Field Effect Transistors (FETs), each having a gate electrode, a drain electrode, and a source electrode. It should be noted that the gate electrode of a FET is referred to as a control electrode or select gate electrode and the drain and source electrodes of a FET are referred to as current carrying electrodes. Similarly, it should be noted that the control gate electrode of a floating gate transistor is referred to as a control electrode and the drain and source electrodes of a floating gate transistor are referred to as current carrying electrodes.

Select transistors 86, 92, 94, and 98 are referred to as drain-side select transistors since they are adjacent and connected to the drain electrodes of storage transistors 88, 93, 96, and 99, respectively. Select transistors 87, 91, 95, and 97 are referred to as source-side select transistors since they are adjacent and connected to the source electrodes of storage transistors 88, 93, 96, and 99, respectively.

Each memory cell has a drain electrode, a source electrode, a drain-side select gate electrode, a source-side select gate electrode, and a control gate electrode. The source electrode of the source-side select transistor is the source electrode of the memory cell and the drain electrode of the drain-side select transistor is the drain electrode of the memory cell. In addition, the select gate electrode of the drain-side select transistor is the drain-side select gate electrode of the memory cell and the select gate electrode of the source-side select transistor is the source-side select gate electrode of the memory cell. Further, the control gate electrode of the storage transistor is the control gate electrode of the memory cell.

The drain-side select gate electrodes of cells 81 and 83 are connected to a word line 101, the control gate electrodes of cells 81 and 83 are connected to a word line 102, and the source-side select gate electrodes of cells 81 and 83 are connected to a word line 103. The source electrodes of cells 81, 82, 83, and 84 are commonly connected to a source line 104. The source-side select gate electrodes of cells 82 and 84 are connected to a word line 106, the control gate electrodes of cells 82 and 84 are connected to a word line 107, and the drain-side select gate electrodes of cells 82 and 84 are connected to a word line 108.

The drain electrodes of cells 81 and 82 are connected to a bit line 109 and the drain electrodes of cells 83 and 84 are connected to a bit line 111.

The processing steps for manufacturing three-transistor memory cell 81 in accordance with the present invention are described with reference to FIGS. 4, 5, and 6. The operation of array 80 is described with reference to FIGS. 7 and 8.

FIG. 4 is a cross-sectional view of memory cell 81 of FIG. 3 during processing in accordance with the present invention. It should be understood that the same reference numerals are used in the figures to denote the same elements. A beginning step for forming cell 81 includes providing a substrate 121. By way of example, substrate 121 is a semiconductor material and is doped with an impurity material of P conductivity type such as, for example, boron. Substrate 121 has a surface 122 and a doping concentration ranging between approximately $1\times10^{15}$ atoms per cubic centimeter (atoms/cm$^3$) and approximately $1\times10^{18}$ atoms/cm$^3$.

A tunnel dielectric layer 123 is grown or deposited on a surface 122 of substrate 121. Suitable materials for tunnel dielectric layer 123 include silicon dioxide, silicon nitride, silicon oxynitride, refractory metal oxides, or the like. Tunnel dielectric layer 123 is preferably thermally grown silicon dioxide and has a substantially uniform thickness of less than approximately 200 angstroms. Preferably, for FN tunneling, tunnel dielectric layer 123 has a substantially uniform thickness ranging between approximately 40 angstroms and approximately 150 angstroms.

A layer 124 of conductive material such as, for example, polysilicon, is deposited on tunnel dielectric layer 123 using, for example, chemical vapor deposition. Other suitable materials for conductive layer 124 include metals, metal silicides, or the like. Preferably, polysilicon layer 124 has a thickness ranging from approximately 500 angstroms to approximately 4000 angstroms. It should be understood that layer 124 is patterned to isolate the floating gates of the storage transistors from each other. However, this aspect of memory cell 81 is not shown in FIG. 4 because it is hidden from the cross-sectional view shown in FIG. 4.

A dielectric layer 126 is grown or deposited on polysilicon layer 124. Suitable materials for dielectric layer 126 include silicon dioxide, silicon nitride, refractory metal oxides, or the like. Further, dielectric layer 126 can be comprised of a plurality of dielectric layers, i.e., stacked or multilayers, such as an Oxide-Nitride-Oxide (ONO) structure. By way of example, dielectric layer 126 has an effective electrical thickness ranging from approximately 100 angstroms to approximately 300 angstroms and a nominal electrical thickness of approximately 200 angstroms.

A layer 127 of conductive material such as, for example, polysilicon, is formed on dielectric 126. A suitable thickness range for polysilicon layer 127 is from approximately 1000 angstroms to approximately 4000 angstroms. A typical thickness for polysilicon layer 127 is approximately 2500 angstroms. Dielectric layer 126 can be referred to as an interpoly dielectric layer since it is formed between two polysilicon layers.

Figure 5:
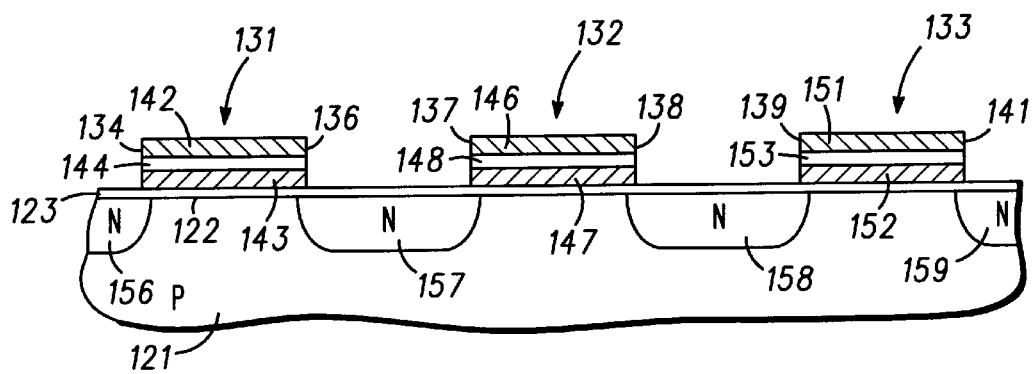
FIG. 5 is a cross-sectional view of the EEPROM cell of FIG. 3 at a later stage of processing.

Now referring to FIG. 5, dielectric layer 126 and polysilicon layers 124 and 127 are patterned to form gate structures 131, 132, and 133. Gate structure 131 has sidewalls 134 and 136, gate structure 132 has sidewalls 137 and 138, and gate structure 133 has sidewalls 139 and 141. Dielectric layer 126 and polysilicon layers 124 and 127 are patterned using a stacked gate etching sequence. The etch is typically a reactive ion etch (RIE) that includes an etching sequence comprised of at least three etching steps to etch through layers 124, 126, and 127. Alternatively, layers 124, 126, and 127 can be etched using discreet etching sequences. Preferably, the etch terminates on tunnel dielectric layer 123 such that tunnel dielectric layer 123 remains intact and substantially uniform across surface 122.

As illustrated in FIG. 5, gate structure 131 includes conductive layers 142 and 143 and an interpoly dielectric layer 144. Similarly, gate structure 132 includes conductive layers 146 and 147 and an interpoly dielectric layer 148 and gate structure 133 includes conductive layers 151 and 152 and an interpoly dielectric layer 153. It should be understood that layers 143, 147, and 152 are formed from portions of layer 124 (FIG. 4), layers 144, 148, and 153 are formed from portions of layer 126 (FIG. 4), and layers 142, 146, and 151 are formed from portions of layer 127 (FIG. 4).

Doped regions 156, 157, 158, and 159 are spaced apart from each other and extend vertically from surface 122 into portions of substrate 121. Doped regions 156, 157, 158, and 159 are preferably formed by implanting an N-type impurity material such as, for example, phosphorus into substrate 121. Doped regions 156, 157, 158, and 159 have a doping concentration ranging between approximately $1\times10^{18}$ atoms/cm$^3$ and approximately $1\times10^{21}$ atoms/cm$^3$. Doped region 156 is laterally aligned to sidewall 134, doped region 157 is laterally aligned to sidewalls 136 and 137, doped region 158 is laterally aligned to sidewalls 138 and 139, and doped region 159 is laterally aligned to sidewall 141.

Optionally, substrate 121 is annealed using techniques well known to those skilled in the art. This thermal process causes doped regions 156, 157, 158, and 159 to laterally diffuse. For example, during annealing, doped region 156 laterally diffuses so that a portion of gate structure 131 overlaps a portion of doped region 156.

Figure 6:
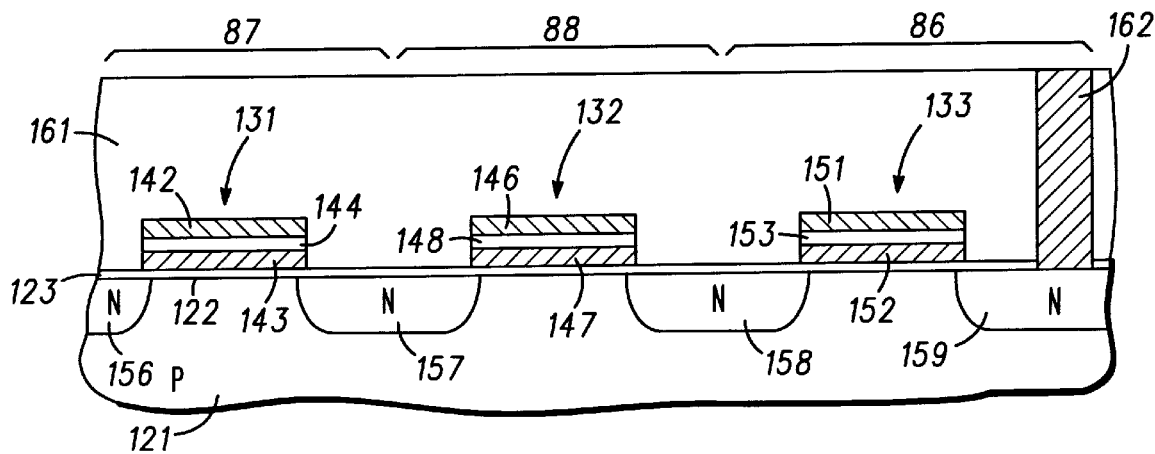
FIG. 6 is a cross-sectional view of the EEPROM cell of FIG. 3 at an even later stage of processing.

FIG. 6 illustrates cell 81 at a later stage of processing. It should be understood that the same reference numerals are used in the figures to denote the same elements. A dielectric material 161 is formed on gate structures 131, 132, and 133 and on portions of tunnel dielectric layer 123. Further, dielectric material 161 is patterned to form a contact opening (not shown) extending to doped region 159 which is filled with a conductive material to form an electrical contact 162.

Conductive layer 143 is the select gate of source-side select transistor 87. Although not shown, conductive layer 142 is electrically connected to select gate 143. This electrical connection is formed outside memory cell 81. Select gate 143 overlies an area between doped regions 156 and 157. Doped region 156 is the source region of source-side select transistor 87 and doped region 157 is the drain region of source-side select transistor 87.

Conductive layer 147 is the floating gate of storage transistor 88 and conductive layer 146 is the control gate of storage transistor 88. Control gate 146 overlies and is preferably aligned to floating gate 147. Further, floating gate 147 is electrically isolated and separated from control gate 146 by dielectric layer 148. Floating gate 147 overlies an area between doped regions 157 and 158. Doped region 157 is the source region of floating gate transistor 88 and doped region 158 is the drain region of storage transistor 88. It should be understood that the drain region of select transistor 87, i.e., doped region 157, is the source region of storage transistor 88. In other words, the drain region of select transistor 87 and the source region of storage transistor 88 are common.

Conductive layer 152 is the select gate of drain-side select transistor 86. Although not shown, conductive layer 151 is electrically connected to select gate 152. This electrical connection is formed outside memory cell 81. Select gate 152 overlies an area between doped regions 158 and 159. Doped region 158 is the source region of drain-side select transistor 86 and doped region 159 is the drain region of drain-side select transistor 86. The drain region of storage transistor 88 and the source region of select transistor 86 are common.

It should be noted that the tunnel dielectric layer 123 has a substantially uniform thickness between select gate 143 and substrate 121, between floating gate 147 and substrate 121, and between select gate 152 and substrate 121. In other words, the thickness of tunnel dielectric layer 123 between select gate 143 and substrate 121, between floating gate 147 and substrate 121, and between select gate 152 and substrate 121 is substantially uniform and the same. In addition, it should be understood that the conductivity types of substrate 121 and doped regions 156, 157, 158, and 159 are not limitations of the present invention. For example, substrate 121 may be doped with an impurity material of N conductivity type and doped regions 156, 157, 158, and 159 can be doped with an impurity material of P conductivity type.

Figures 7, 8:
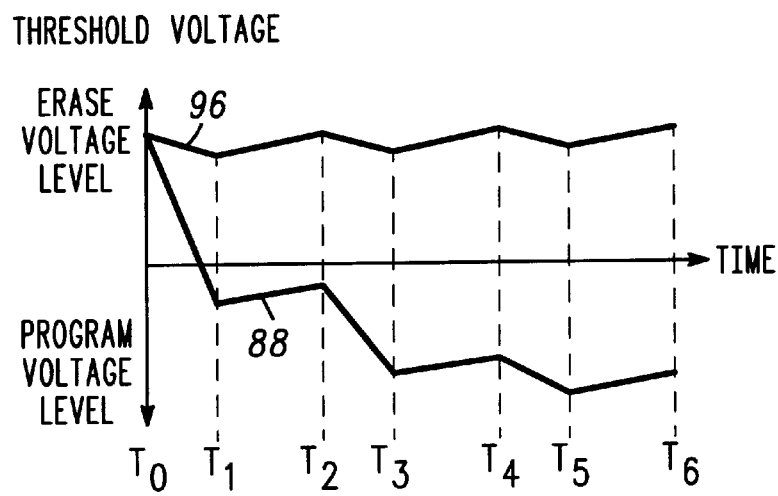
FIG. 7 is a Table for demonstrating a method of operating the array of FIG. 3.
FIG. 8 is a timing diagram illustrating the programming and erasing of EEPROM cells of the array of FIG. 3.

One example for operating array 80 is discussed with reference to FIGS. 3 and 7. FIG. 7 is a Table 190 provided to demonstrate a particular set of voltage values for programming and erasing the cells of array 80. In particular, Table 190 illustrates the voltages applied to the electrodes of the selected memory cells in a selected row and the voltages applied to the electrodes of the unselected memory cells in an unselected row. It should be noted that the voltages shown in FIG. 7 are not limitations of the present invention. These voltages are shown for purposes of illustration.

The storage transistors of array 80 have an initial value or state. In other words, the storage transistors of array 80 are initially programmed or erased. In this example, a programmed state indicates that the storage transistor has a low threshold voltage level and an erased state indicates that the storage transistor has a high threshold voltage level. FN tunneling is used for raising and lowering the threshold voltage levels of the storage transistors of array 80. In order to raise the threshold level of a storage transistor, its floating gate is negatively charged by electrons tunneling to the floating gate electrode. On the other hand, to lower the threshold level of a storage transistor, its floating gate is positively charged by electrons tunneling away from the floating gate electrode.

To program or erase cells in a selected row of array 80, the control gates of the selected cells are toggled between a negative voltage of approximately −12 volts and a positive voltage of approximately 12 volts. By way of example, the first row of array 80 which contains cells 81 and 83 is the selected row and the second row of array 80 which contains cells 82 and 84 is the unselected row. Cell 81 is to be programmed from an initially erased state and cell 83 remains in the initially erased state. Thus, the control gates of cells 81 and 83 are toggled between a negative voltage of approximately −12 volts and a positive voltage of approximately 12 volts.

A programming voltage of approximately 5 volts is applied to the drain of selected cell 81 by applying approximately 5 volts to bit line 109. An erasing voltage of approximately 0 volts is applied to the drain of the selected cell 83 by applying approximately 0 volts to bit line 111. Further, a voltage of approximately 5 volts is applied to word line 101 to turn on drain-side select transistors 86 and 94. This allows the programming voltage at the drain of transistor 86 to be transmitted to the drain of storage transistor 88. In addition, the erasing voltage at the drain of transistor 94 is transmitted to the drain of storage transistor 96. A voltage of approximately 0 volts is applied to the source-side select gates of selected cells 81 and 83 by applying approximately 0 volts to word line 103. This turns off source-side select transistors 87 and 95. Further, a voltage of approximately 0 volts is applied to the source-side select gates of unselected cells 82 and 84 by applying approximately 0 volts to word line 106. Turning off source-side select transistors 87, 91, 95, and 97 prevents source-disturb events in array 80 by isolating unselected cells 82 and 84 from the programming and erasing voltages applied to selected cells 81 and 83. A voltage of approximately 0 volts is applied to the drain-side select gates of unselected cells 82 and 84 for turning off drain-side select transistors 92 and 98. This prevents drain-disturb events by isolating unselected storage transistors 93 and 99 from the programming and erasing voltages applied to bit lines 109 and 111.

FIG. 8 is a timing diagram illustrating the programming of selected cell 81 (FIG. 3) and the erasing of selected cell 83 (FIG. 3). Erased and programmed threshold voltage levels are indicated along the THRESHOLD VOLTAGE axis and time is denoted along the TIME axis. In the example described hereinbefore, cells 81 and 83 are initially erased. Therefore, the threshold voltage levels of storage transistors 88 and 96 (FIG. 3) are initially at the erased threshold voltage level which is higher than the programmed threshold voltage level.

Between times $T_0$ and $T_1$, a negative voltage of approximately −12 volts is applied to the control gates of storage transistors 88 and 96. The threshold voltage level of storage transistor 96 is degraded and shifts toward the program voltage level when a negative voltage of approximately −12 volts is applied to word line 102. The threshold voltage of storage transistor 96 begins at the erase voltage level as indicated in FIG. 8, and decreases below that level by time $T_1$. The negative voltage of −12 volts applied to the control gate of storage transistor 96 is not sufficient to lower the threshold voltage of storage transistor 96 to the program voltage level. Between times $T_1$ and $T_2$, the positive voltage of approximately 12 volts is applied to word line 102. During this time, the threshold voltage of transistor 96 increases back to the erase voltage level. Between times $T_2$ and $T_6$ the voltage applied to the control gate of storage transistor 96 is toggled between approximately −12 volts and approximately 12 volts. For example, a negative voltage of approximately −12 volts is also applied to the control gate of storage transistor 96 between times $T_2$ and $T_3$ and between times $T_4$ and $T_5$, whereas a positive voltage of approximately 12 volts is also applied to the control gate of storage transistor 96 between times $T_3$ and $T_4$ and between times $T_5$ and $T_6$. As the voltage on the control gate of storage transistor 96 toggles between the negative voltage and the positive voltages, the threshold voltage of transistor 96 falls and rises, but remains at or below the erase voltage level.

The threshold voltage of storage transistor 88 begins at the erase voltage level. Between times $T_2$ and $T_6$ the voltage applied to the control gate of storage transistor 88 is toggled between approximately −12 volts and approximately 12 volts. For example, a negative voltage of approximately −12 volts is applied to the control gate of storage transistor 88 between times $T_2$ and $T_3$ and between times $T_4$ and $T_5$, whereas a positive voltage is applied to the control gate of storage transistor 88 between times $T_3$ and $T_4$ and between times $T_5$ and $T_6$. At time period $T_1$, the threshold voltage of storage transistor 88 falls below the erase voltage level and is approaching the program voltage level. Between time $T_1$ and $T_2$, the threshold voltage of transistor 88 increases towards the erase voltage level. This increase is limited as a result of a programming voltage of approximately 5 volts being applied to the drain of storage transistor 88. Between times $T_2$ and $T_3$, the threshold voltage of transistor 88 continues to increase towards the program voltage level. By time $T_5$, transistor 88 is in the programmed state, wherein the threshold voltage of storage transistor 88 is at the program voltage level.

During a read operation of a cell of array 80, a voltage of approximately 1 volt is applied to both the control gate and the drain of the cell. In addition, a voltage of approximately 5 volts is applied to both the source-side select gate and the drain-side select gate of the memory cell. The substantially uniform thickness of tunnel dielectric layer 123 (FIG. 6) allows for a faster operating time of array 50 compared to prior art memory arrays having cells with two different gate dielectric layer thicknesses. In particular, the access time of the cells of array 80 decreases during read operations.

By now it should be appreciated that a non-volatile memory cell and a method for manufacturing the cell have been provided. An advantage of the present invention is that it provides an NVM cell that prevents drain-disturb and source-disturb events. By preventing drain-disturb and sours-disturb events, the present invention provides a non-volatile memory cell which enhances multi-level bit cell applications. Further, within each cell, the tunnel dielectric layer between the floating gate and the substrate and between the select gates and the substrate has a substantially uniform thickness. This is advantageous since it reduces the number of processing steps for manufacturing this structure and decreases the access time of the cell during read operations.

What is claimed is:

1. A memory array, comprising:
   a three-transistor memory cell comprising:
   a substrate;
   a dielectric layer on the substrate;
   a first select gate on a first portion of the dielectric layer;
   a floating gate on a second portion of the dielectric layer; and
   a second select gate on a third portion of the dielectric layer, wherein a thickness of the dielectric layer between the first select gate and the substrate, between the floating gate and the substrate, and between the second select gate and the substrate is substantially uniform.

2. The memory array of claim 1, wherein the three-transistor memory cell further comprises:
   first, second, third, and fourth doped regions extending from a surface of the substrate into the substrate and spaced apart from each other;
   wherein the first select gate is between the first doped region and the second doped region;
   wherein the floating gate is between the second doped region and the third doped region; and
   wherein the second select gate is between the third doped region and the fourth doped region.

3. The memory array of claim 2, wherein the three-transistor memory cell includes a first select transistor, a second select transistor, and a floating gate transistor, wherein the first doped region serves as the drain of the first select transistor, the second doped region serves as both the source region of the first select transistor and as the drain region of floating gate transistor, the third doped region serves as both the source region of the floating gate transistor and as the drain region of the second select transistor, and the fourth doped region serves as the source of the second select transistor.

4. The memory array of claim 1, wherein the thickness of the dielectric layer is less than 90 angstroms.

5. A non-volatile memory cell, comprising:
   a substrate having a surface;
   a tunnel dielectric layer on the substrate and having a substantially uniform thickness;
   a first select transistor having a drain region extending from the surface into the substrate, a source region extending from the surface into the substrate, and a gate on a portion of the tunnel dielectric layer between the source region of the first select transistor and the drain region of the first select transistor;
   a floating gate transistor having a drain region extending from the surface into the substrate, a source region, a floating gate on a portion of the tunnel dielectric layer between the source region of the floating gate transistor and the drain region of the floating gate transistor, and a control gate overlying the floating gate, wherein the drain region of the first select transistor and the source region of the floating gate transistor are common; and
   a second select transistor having a drain region extending from the surface into the substrate, a source region, a gate on a portion of the tunnel dielectric layer between the source region of the second select transistor and the drain region of the second select transistor, wherein the drain region of the floating gate transistor and the source region of the second select transistor are common.

6. The non-volatile memory cell of claim 5, wherein the substantially uniform thickness of the tunnel dielectric layer is less than approximately 200 angstroms.

7. The non-volatile memory cell of claim 5, wherein the substantially uniform thickness of the tunnel dielectric layer ranges between approximately 40 angstroms and 120 angstroms.

8. The non-volatile memory cell of claim 5, wherein the tunnel dielectric layer is silicon dioxide.

9. The non-volatile memory cell of claim 5, further including an interpoly dielectric separating the floating gate and the control gate of the floating gate transistor.

10. A memory cell, comprising:
a first select transistor having a gate, a drain, and a source;
a storage transistor having a control gate, a floating gate, a drain connected to the source of the first select transistor, and a source; and
a second select transistor having a gate, a drain connected to the source of the storage transistor, and a source, wherein the gate of the first select transistor, the gate of the second select transistor, and the floating gate of the storage transistor are each formed on a dielectric layer having a substantially uniform thickness.

11. The memory cell of claim 10, wherein the first select transistor, the second select transistor, and the storage transistor form a three-transistor memory cell.

12. The memory cell of claim 10, wherein the first and second select transistors are devoid of a floating gate.

13. The memory cell of claim 10, wherein the substantially uniform thickness of the tunnel dielectric layer is less than approximately 90 angstroms.

14. The memory cell of claim 10, wherein the first select transistor is a drain-side select transistor for preventing drain-disturb events.

15. The memory cell of claim 10, wherein the second select transistor is a source-side select transistor for preventing source-disturb events.

16. A memory array, comprising:
a first memory cell having a drain electrode coupled to a bit line of the memory array, a source electrode, a drain-side select gate electrode coupled to a first word line of the memory array, a source-side select gate electrode coupled to a second word line of the memory array, and a control gate electrode coupled to a third word line of the memory array, wherein the first memory cell is a three-transistor memory cell comprising:
a substrate;
a dielectric layer over the substrate;
a first select transistor having a gate, a drain, and a source;
a storage transistor having a control gate, a floating gate, a drain connected to the source of the first select transistor, and a source; and
a second select transistor having a gate, a drain connected to the source of the storage transistor, and a source, wherein a thickness of the dielectric layer between the gate of the first select transistor and the substrate, between the floating gate and the substrate, and between the gate of the second select transistor and the substrate is substantially uniform; and
a second memory cell having a drain electrode coupled to the bit line of the memory array, a source electrode coupled to the source electrode of the first memory cell, a drain-side select gate electrode coupled to a fourth word line of the memory array, a source-side select gate electrode coupled to a fifth word line of the memory array, and a control gate electrode coupled to a sixth word line of the memory array.

17. The memory array of claim 16, wherein the second memory cell is a three-transistor memory cell comprising:
a third select transistor having a gate, a drain, and a source;
a second storage transistor having a control gate, a floating gate, a drain connected to the source of the third select transistor, and a source; and
a fourth select transistor having a gate, a drain connected to the source of the second storage transistor, and a source, wherein the gates of the third and fourth select transistors and the floating gate of the second storage transistor are each formed on the dielectric layer and the thickness of the dielectric layer between the substrate and the gates of the third and fourth select transistors and the substrate and the floating gate of the second storage transistor is substantially uniform.

18. The memory array of claim 16, further comprising:
a third memory cell having a drain electrode coupled to a second bit line of the memory array, a source electrode coupled to the source electrode of the first memory cell, a drain-side select gate electrode coupled to the first word line of the memory array, a source-side select gate electrode coupled to the second word line of the memory array, and a control gate electrode coupled to the third word line of the memory array; and
a fourth memory cell having a drain electrode coupled to the second bit line of the memory array, a source electrode coupled to the source electrode of the first memory cell, a drain-side select gate electrode coupled to the fourth word line of the memory array, a source-side select gate electrode coupled to the fifth word line of the memory array, and a control gate electrode coupled to the sixth word line of the memory array.

19. The memory array of claim 18, wherein the third memory cell is a three-transistor memory cell comprising:
a third select transistor having a gate, a drain, and a source;
a second storage transistor having a control gate, a floating gate, a drain connected to the source of the third select transistor, and a source; and
a fourth select transistor having a gate, a drain connected to the source of the second storage transistor, and a source, wherein the gates of the third and fourth select transistors and the floating gate of the second storage transistor are each formed on the dielectric layer and the thickness of the dielectric layer between the substrate and the gates of the third and fourth select transistors and between the substrate and the floating gate of the second storage transistor is substantially uniform.

20. The memory array of claim 19, wherein the fourth memory cell is a three-transistor memory cell comprising:
a fifth select transistor having a gate, a drain, and a source;
a third storage transistor having a control gate, a floating gate, a drain connected to the source of the fifth select transistor, and a source; and
a sixth select transistor having a gate, a drain connected to the source of the third storage transistor, and a source, wherein the gates of the fifth and sixth select transistors and the floating gate of the third storage transistor are each formed on the dielectric layer and the thickness of the dielectric layer between the substrate and the gates of the fifth and sixth select transistors and between the substrate and the floating gate of the third storage transistor is substantially uniform.

\* \* \* \* \*